United States Patent [19]

Millhollan et al.

[11] 3,973,246

[45] Aug. 3, 1976

[54] SENSE-WRITE CIRCUIT FOR BIPOLAR INTEGRATED CIRCUIT RAM

[75] Inventors: Michael S. Millhollan, Mesa; Ronald L. Treadway, Scottsdale, both of Ariz.

[73] Assignee: Motorola, Inc., Chicago, Ill.

[22] Filed: July 11, 1975

[21] Appl. No.: 595,241

Related U.S. Application Data

[62] Division of Ser. No. 428,153, Dec. 26, 1973.

[52] U.S. Cl. ................... 340/173 FF; 307/235 R; 340/173 R
[51] Int. Cl.² ........................................ G11C 11/44
[58] Field of Search ............ 340/173 FF, 173 R; 307/235 R, 238, 291

[56] References Cited
UNITED STATES PATENTS

| | | | |
|---|---|---|---|
| 3,292,014 | 12/1966 | Brooksby | 307/238 |
| 3,307,047 | 2/1967 | Narud et al. | 307/291 |
| 3,538,348 | 11/1970 | Hillis et al. | 307/291 |
| 3,540,005 | 11/1970 | Bernhardt et al. | 340/173 FF |
| 3,713,115 | 1/1973 | Duben | 340/173 FF |
| 3,760,194 | 9/1973 | Lutz et al. | 307/235 R |

*Primary Examiner*—Marshall M. Curtis
*Attorney, Agent, or Firm*—Harry M. Weiss; Charles R. Hoffman

[57] ABSTRACT

A bipolar sense-write circuit is provided for sensing voltage levels representative of a logical "1" or "0" stored in a flip-flop storage cell and for writing voltage levels into the flip-flop storage cell. The sense-write circuit includes first and second amplifier stages which, when coupled to a selected flip-flop storage cell produce a voltage in the amplifier section approximately equal to the voltage on a collector node in the flip-flop storage cell. Each amplifier stage of the sense-write circuit utilizes a side of the selected flip-flop storage cell as a part of that amplifier stage, if the corresponding side of the flip-flop storage cell is "on". The amplifier stage connected to the "on" side of the selected flip-flop storage cell acts as a unity gain amplifier, such that the row selection voltage appears at the output of that amplifier stage. This arrangement allows the data stage of memory cell flip-flop to be sensed without the use of any fixed reference voltage generated external to the memory cell. The arrangement provides the additional benefit of reducing the required difference between the internal memory cell flip-flop voltages, proportionately decreasing the time required to write a given state into the flip-flop memory cell.

2 Claims, 2 Drawing Figures

3,973,246

SENSE-WRITE CIRCUIT FOR BIPOLAR INTEGRATED CIRCUIT RAM

This is a division of application Ser. No. 428,153, filed Dec. 26, 1973.

BACKGROUND OF THE INVENTION

Integrated circuit bipolar random access memories (RAMs) have found widespread use in high speed digital computers as intermediate "scratch-pad" memories or "cache" memories. The basic requirements on such bipolar RAMs has been that they provide relatively high speed operation at a relatively low cost, since such memories must interface between the high speed (high cost) arithmetic section of digital computers and the slower main memories, which must provide low cost storage for the storage of the programs and data being processed.

A widely used flip-flop memory cell for such bipolar RAMs includes two cross-coupled inverters each having a resistor as a load device and a dual emitter transistor as a switching device. Two emitters, one from each transistor, are coupled together and connected to a standby current source and also to the two corresponding emitters of each of the other flip-flop memory cells in the same row. The other two emitters each are coupled to corresponding sense-write conductors which are shared with the other flip-flop memory cells in the same column. The sense-write circuits known in the art utilize the interaction between the internal collector node voltage of a selected flip-flop storage cell and a reference threshold voltage generated externally from the flip-flop memory cells to set the state of a differential pair of transistors in the sense amplifier portion of the sense-write circuit to produce an output differential sense voltage. The main shortcoming of such sense-write circuits is that the reference threshold voltage must be selected so that it lies between the two collector node voltages of the selected flip-flop storage cell. The relationship between the magnitude of the differential memory cell collector voltage and the reference voltage must be such that the "on" side flip-flop storage cell transistor base voltage is greater than the threshold reference voltage by an amount sufficient to ensure differential switching and the reference threshold voltage must be greater than the "off" side memory cell transistor base voltage by a similar amount. This implies that the magnitude of the differential memory cell collector voltage must be at least twice that which is required for differential switching. In addition, the magnitude of the differential memory cell collector voltage must be still greater by an amount sufficient to allow for tolerance variations in the memory cell collector voltages, which are caused mainly by variations in tolerance of the memory cell load resistors. In order to increase the tolerance of the load resistors, it is necessary because of photolithographic limitations in the present manufacturing methods to increase their physical size. This, of course, reduces the number of memory cells per chip, increasing the chip size, and hence, the cost per bit of memory storage. Further, performance is impaired due to the increased parasitic capacitances associated with an increase in physical size. Also, the necessity of increasing the magnitude of the difference between the flip-flop memory cell collector voltages increases the memory cell time constants, increasing the time required for the cell to switch states during a write operation.

SUMMARY OF THE INVENTION

It is an object of this invention to provide a sense-write circuit suitable for use in memory devices which allows the use of lower tolerance, physically smaller components to be used in associated flip-flop storage cells than has been previously possible.

It is another object of the invention to provide a sense-write circuit suitable for use in bipolar integrated random access memories which does not require the generation of a threshold reference voltage generated externally to the flip-flop storage cells.

It is another object of the invention to provide the sense-write circuit for a bipolar random access memory which includes two cross-coupled amplifier stages which, in cooperation with the corresponding "on" side of a selected random access memory flip-flop memory cell act alternately as unity gain amplifiers with respect to the row selection voltage.

It is another object of this invention to provide a sense-write circuit for a bipolar random access memory which utilizes a feedback arrangement of internal voltages of a memory cell flip-flop to sense its data state.

It is another object of this invention to provide a sense-write circuit for a random access memory in which two unity gain amplifier sections are cross-coupled so as to allow the voltage drop across the collector load resistor of a selected memory cell flip-flop to be reduced to only the voltage required to set the state of a differentially connected pair of transistors.

Briefly described, the invention provides a sense-write circuit for the bipolar random access memory including a first amplifier circuit having an output node connected to the input node of a first emitter follower driver circuit. The sense-write circuit also includes a second amplifier circuit having a second emitter follower output circuit. The first and second amplifier circuits include input stages which are connected, respectively, to the sense-write lines shared by a column of flip-flop storage cells. The row selection circuitry for the selected row, and the "on" side of the selected flip-flop memory cell and the input section of the corresponding amplifier circuit form a unity gain amplifier which produces at a node thereof, the base node voltage of the "on" side of the selected memory cell flip-flop. This overcomes the necessity of providing an externally generated threshold reference voltage, since the opposite amplifier section produces a substantially lower voltage at its output, determined by circuit components external to the memory cell.

Write input circuitry coupled to the input stage of each of the first and second amplifier circuits causes current conducted through the "on" side of the flip-flop memory cell to be switched to the adjacent unity gain amplifier section which causes a transition which is coupled through a driver circuit to the input of the opposite amplifier circuit, causing the voltage on the opposite sense-write line to be reduced, turning on the opposite switching transistor of a flip-flop memory cell.

DESCRIPTION OF THE INVENTION

Figure 1:
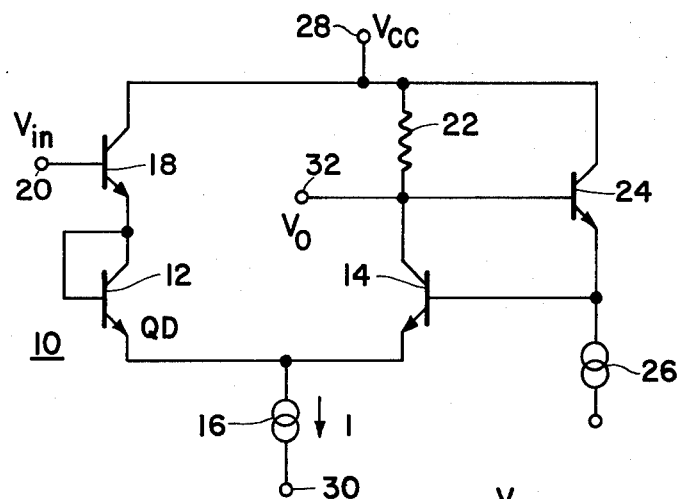
FIG. 1 is a schematic drawing of a unity gain amplifier which is useful in describing the operation of the sense-write circuit and the associated portion of the selected flip-flop memory cell according to the invention.
Figure 2:
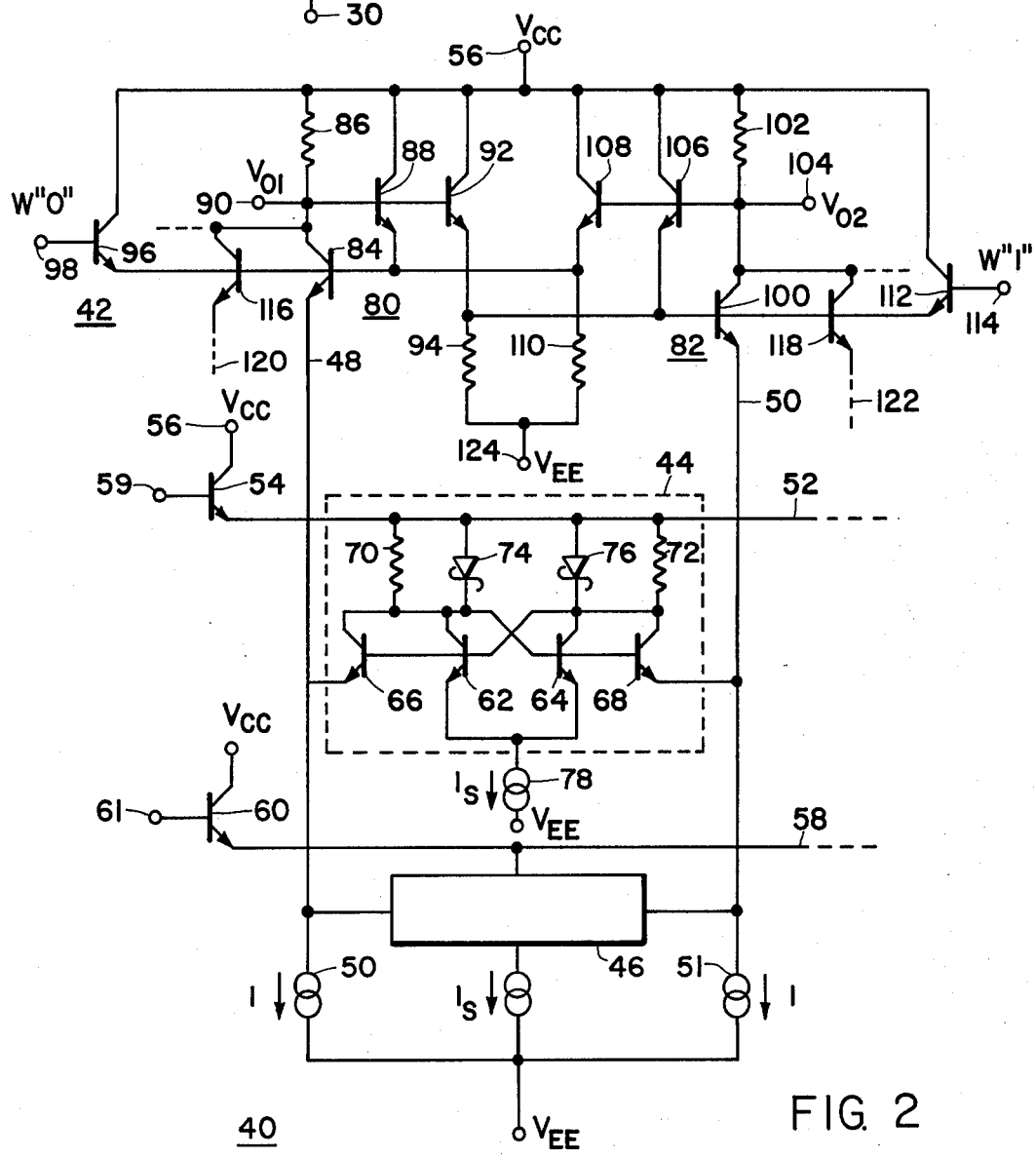
FIG. 2 is a schematic diagram of a sense-write amplifier and an associated selected flip-flop memory cell sensed and controlled by the sense-write circuit.

Circuit 10 schematically depicted in FIG. 1 is useful in describing the operation of portions of the sense-write circuit of FIG. 2 during a read operation, and will be referred to in the ensuing discussion.

FIG. 2 is a schematic diagram of a sense-write amplifier which is a preferred embodiment of the invention. FIG. 2 depicts part of a bipolar memory system 40 which includes a plurality of bipolar random access memory (RAM) cells 44 and 46 which share a pair of sense-write conductors 48 and 50. A plurality of columns of RAM cells sharing additional pairs of sense-write buses such as 120 and 122 may be coupled to sense-write amplifier 42.

The configuration of RAM cells 44 and 46 is well known, and is described herein in order to facilitate discussion of the operation of the inventive sense-write amplifier 42 in conjunction with sensing storage states in the RAM cells and writing new information into them.

Storage cell 44 includes cross-coupled transistors 62 and 64 which have their emitters connected together to a standby current source 78, which is shared by other storage cells in the same row (not shown). The base of transistor 62 is connected to the collector of transistor 64. The base of transistor 64 is coupled to the collector of transistor 62. Gating transistor 66 is normally formed in the same isolated epitaxial region as transistor 62 which serves as a common collector. The base regions of transistors 62 and 66 are also common. Transistors 62 and 66 can be considered as a single double emitter transistor if desired. Transistors 62 and 66 have their collectors coupled to load resistor 70, the opposite end of which is connected to row select conductor 52, which in turn is connected to the emitter of row select transistor 54. The base of row select transistor 54 is connected to row selection circuitry (not shown). Similarly, the second gating transistor 68 is formed so that it shares a base region and a collector region with transistor 64. Second load resistor 72 is coupled between the collector of transistors 64 and 68 and row selection conductor 52. The emitter of gating transistor 66 is connected to sense-write bus 48 and the emitter of gating transistor 68 is coupled to sense-write bus 50. Schottky diodes 74 and 76 (optional) may be connected in parallel with load resistors 70 and 72, respectively, to provide faster circuit operation, as subsequently explained. Sense-write amplifier 42 includes a first amplifier portion including transistors 84, 86, and load resistor 88, and also includes a first driver section, an emitter follower, including transistor 92 and resistor 94. The opposite side of sense-write amplifier 42 includes a second amplifier section including transistors 100, 106 and also load resistor 102. The right-hand side of sense amplifier circuit 42 also includes second driver circuit including transistor 108 and resistor 110, forming an emitter follower driver.

The write circuitry portion of circuit 42 includes Write "0" circuitry including transistor 96 in combination with the first amplifier and driver sections. Transistor 84 has its emitter connected to sense-write line 48, its base connected to the emitters of transistors 88, 96, and 108, and its collector connected to output node 90, one end of resistor 86, the base of transistor 86, and the base of first emitter follower transistor 92. The other terminal of load resistor 86 is connected to $V_{CC}$ power supply voltage conductor 56. The collectors of transistors 88, 92 and 96 are connected to $V_{CC}$ conductor 56. The base of transistor 96 is connected to Write 0 conductor 98. Transistor 100 of the second amplifier section has its emitter connected to sense-write bus 50 and its base connected to the emitter of transistor 92, the emitter of transistor 106, and the emitter of transistor 112. Transistor 100 has its collector connected to output conductor 104, one end of load resistor 102 and the bases of transistors 106 and 108. Transistors 106, 108 and 112 have their collector electrodes coupled to $V_{CC}$ conductor 56. Write "1" transistor 112 has its base coupled to Write 1 conductor 114. Emitter follower resistors 94 and 110 are coupled, respectively, between the emitters of transistors 92 and 108 and $V_{EE}$ conductor 124.

As explained subsequently, sense-write amplifier circuit 42 can be coupled to a plurality of columns of memory cells. However, it interacts with, or senses information stored or writes information into only one selected column of cells, of which only one row is selected at a time. The column is selected by means of current sources 50 and 51 which represent column selection circuitry. A given row is selected by application of the proper row selection voltage to one of transistors 54, 60, etc. An additional pair of amplifier switching transistors 116 and 118 are shown having a common base connection with, respectively, transistors 84 and 100 and also having, respectively, common collector connections therewith. The emitter of transistor 116 is connected to sense-write bus 120 while the emitter of transistor 118 is connected to sense-write bus 122. Sense-write buses 120 and 122 are shared by a separate column of RAM cells (not shown). In a similar manner, additional sense-write transistors may be added in parallel with transistors 84 and 100 to facilitate servicing of additional columns of RAM cells by sense-write amplifier 42.

The operation of the sense-write circuit of the subject invention can best be explained by first referring to the circuit shown in FIG. 1. This circuit is a voltage follower, or unity gain amplifier. The output voltage $V_0$, on node 32, follows the input voltage $V_{in}$ on node 20 when $V_{in}$ ranges between the power supply voltage $V_{CC}$ and $V_{CC}-IR$, where R is the resistance of resistor 22 and I is the current through current source 16. The operation of the circuit of FIG. 1 is essentially as follows. The current I through current source 16 is split between the path consisting of transistors 18 and 12 and the path including transistor 14 and resistor 22. As long as transistors 18, 12, and 14 are "on", the common emitters of emitter-coupled transistors 12 and 14 will be at a potential equal to $V_{in}$ minus the emitter-to-base voltage drops of transistor 18 and transistor 12. The output voltage $V_0$ at node 32 will be equal to this potential plus the emitter-to-base voltage drops of transistors 14 and 24. Thus, $V_0$ is approximately equal to $V_{in}$. This condition will prevail as long as $V_{in}$ is greater than $V_{CC}-IR$, at which point transistor 18 turns off, and all of the current I flows through the right-hand current path including transistor 14 and resistor 22.

If the diode-connected transistor $Q_D$ in FIG. 1 is replaced by the "on" side of a flip-flop storage cell, and if two such circuits are cross-coupled, a circuit similar to the circuit shown in FIG. 2 is obtained, and the stored state of the flip-flop storage cell can be detected or altered.

Referring to the circuit of FIG. 2, it is seen that the base of transistor 84 will be at the same voltage as the base of the "on" side of the flip-flop storage cell 44, and the output voltage $V_{01}$ is approximately equal to the row select voltage applied to node 59. This portion of the circuit functions in the same manner as the unity gain amplifier 10 shown in FIG. 1. By coupling the voltage present on the base of transistor 84 through the emitter follower including transistor 92 and resistor 94 to the base of transistor 100, a differentially connected pair consisting of the "off" transistor 68 of the flip-flop storage cell 44 and transistor 100 is formed. (It is assumed for the present discussion that flip-flop storage cell 44 is in a logic state such that transistors 62 and 66 are "on" while transistors 64 and 68 are "off".) The base of transistor 100 is more positive than the base of the "off" memory cell transistor 68 by approximately the differential base voltage of the flip-flop storage cell which is developed across load resistor 70, and transistor 100 conducts the sense-write line source current I through current source 51 such that the output voltage $V_{02}$, is equal to $V_{cc}-IR$, where R is the resistance of resistors 86 and 102. The storage state of the flip-flop storage cell 44 is now represented by the differential voltage equal to $V_{01}-V_{02}$, which is equal to $V_{55}-V_{cc}+IR$, where $V_{55}$ is the row selection voltage applied to node 55. It should be noted that the differential base voltage required to be developed across the load resistor 70 need only be large enough to switch a differentially connected transistor pair.

The storage state of the flip-flop storage cell 44 may be controlled by the sense-write circuit, as follows. If the base of transistor 84 is driven more positive than the base of the "on" transistor 66 of the flip-flop storage cell 44 by the Write 0 input voltage applied to node 98, the circuit operation as a voltage follower is disrupted and a differential transistor pair is formed between transistor 66 of the flip-flop storage cell and transistor 84. The base of transistor 84 is more positive, and therefore transistor 84 conducts the sense-write source current I flowing through current source 50. The output of first amplifier stage, $V_{01}$, goes low and the base of transistor 100 follows it. Transistor 100 now forms a differential pair with "off" transistor 68 of the flip-flop storage cell 44 and as the base of transistor 100 falls below the base of the transistor 68, it begins to conduct the sense-write line source current I flowing through current source 51, causing switching of the state of flip-flop storage cell 44. The output voltage $V_{02}$ now rises and follows the row selection voltage applied at node 55.

Thus, it is seen that the sense-write circuit of the invention utilizes a feedback arrangement of the internal differential voltages of a flip-flop storage cell to sense the stored data state. This differential feedback allows the data state of flip-flop storage cell to be sensed without the use of any fixed reference voltage generated external to the flip-flop storage cell. It also allows the voltage drop across the collector load resistor of the selected flip-flop storage cell to be reduced to only that required to switch a pair of differentially connected transistors. Further, the tolerance and therefore the physical size required for the storage cell load resistors is reduced, increasing the storage cell density. The reduction in capacitance at the collector nodes of the storage cell due to the reduced physical size and the reduced required differential voltage results in a substantial increase in the speed of writing new information into the cell.

While the circuit of the present invention has been described with regard to a particular embodiment thereof, it will be recognized by those skilled in the art that variations in connection of components may be made to suit various requirements within the scope of the invention.

What is claimed is:

1. A sense-write circuit for detecting and amplifying a stored logic level and for writing a logic level into a storage circuit, said sense-write circuit being coupled to said logic circuit comprising:

a first amplifier circuit including first resistive means and first and second electron control means each having first and second main electrodes and a control electrode;

a second amplifier including second resistive means and third and fourth electron control means each having first and second main electrodes and a control electrode;

said first resistive means being coupled between a first voltage conductor and an output node of said first amplifier circuit, and first electron control means having a first main electrode coupled to said output node of said first amplifier circuit and said second main electrode connected to a sense-write conductor, said second electron control means being coupled between said first voltage conductor and said control electrode of said first electron control means and having its control electrode coupled to said output node of said first amplifier circuit;

said third electron control means and said second resistive means being coupled in series between said first voltage conductor and said second voltage conductor, said control electrode of said third electron control means being coupled to said output node of said first amplifier circuit;

said third resistive means being coupled between said first voltage conductor and an output node of said second amplifier circuit, said fourth electron control means being coupled between said output node of said second amplifier circuit and a second sense-write conductor, said fifth electron control means being coupled between said first voltage conductor and said control electrode of said fourth electron control means and having its control electrode coupled to said output node of said second amplifier circuit;

said sixth electron control means and said fourth resistive means being coupled in series between said first and second voltage conductors, said control electrode of said sixth electron control means being coupled to said output node of said second amplifier circuit;

an input circuit having an input node for receiving a write input signal, said write input circuit being coupled to said control electrode of said first electron control means and to said control electrode of said fourth electron control means;

said control electrode of said electron control means being coupled to said control electrode of said fourth electron control means;

said second main electrode of said sixth electron control means being coupled to said control electrode of said first electron controls means;

said first and second sense-write conductors being coupled to at least one storage circuit, said storage circuit including first and second cross-coupled electron control means and first and second resistive load means.

2. The sense-write circuit as recited in claim 1 wherein said write circuit includes seventh and eighth electron control means, said seventh electron control means being coupled between said first voltage conductor and said control electrode of said first electron control means and its control electrode coupled to a said write conductor, said eighth electron control means having a control electrode coupled to a second write conductor and being coupled between said first voltage conductor and said control electrode of said fourth electron control means.

* * * * *